United States Patent
Li

(10) Patent No.: US 10,310,607 B2
(45) Date of Patent: Jun. 4, 2019

(54) TOUCH DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD, Beijing (CN)

(72) Inventor: Yanqiu Li, Beijing (CN)

(73) Assignees: BOE TECHNOLOGY GROUP CO., LTD., Beijing (CN); BEIJING BOE DISPLAY TECHNOLOGY CO., LTD, Beijing (CN)

(*) Notice: Subject to any disclaimer, the term of this patent is extended or adjusted under 35 U.S.C. 154(b) by 0 days.

(21) Appl. No.: 15/572,150

(22) PCT Filed: Jun. 19, 2017

(86) PCT No.: PCT/CN2017/088941
§ 371 (c)(1),
(2) Date: Nov. 6, 2017

(87) PCT Pub. No.: WO2018/040675
PCT Pub. Date: Mar. 8, 2018

(65) Prior Publication Data
US 2018/0292903 A1 Oct. 11, 2018

(30) Foreign Application Priority Data
Aug. 30, 2016 (CN) .......................... 2016 1 0786395

(51) Int. Cl.
G06F 3/041 (2006.01)
G06F 3/01 (2006.01)
H01L 27/32 (2006.01)

(52) U.S. Cl.
CPC ............ G06F 3/016 (2013.01); G06F 3/0412 (2013.01); G06F 3/0416 (2013.01); H01L 27/323 (2013.01); G06F 2203/04103 (2013.01)

(58) Field of Classification Search
CPC . G06F 3/01; G06F 3/016; G06F 3/041; G06F 3/0416; H01L 27/323; G09G 5/00
See application file for complete search history.

(56) References Cited

U.S. PATENT DOCUMENTS

2006/0209037 A1* 9/2006 Wang ...................... G06F 3/016
345/173
2009/0295739 A1 12/2009 Nagara
(Continued)

FOREIGN PATENT DOCUMENTS

CN          87211354 U     8/1988
CN          101989139 A    3/2011
(Continued)

OTHER PUBLICATIONS

International Search Report received for PCT Patent Application No. PCT/CN2017/088941, dated Aug. 30, 2017, 8 pages (3 pages of English Translation and 5 pages of Original Document).

Primary Examiner — Joe H Cheng
(74) Attorney, Agent, or Firm — Womble Bond Dickinson (US) LLP

(57) ABSTRACT

A touch display panel includes a touch display module, a plurality of touch feedback electrodes, and a first controller. Each of the plurality of touch feedback electrodes is operable to vibrate in response to a drive signal applied thereto, thereby providing touch feedback. The first controller is configured to generate and provide the drive signal to at least one of the plurality of touch feedback electrodes corresponding to a touch position.

14 Claims, 2 Drawing Sheets

(56) References Cited

U.S. PATENT DOCUMENTS

| | | | |
|---|---|---|---|
| 2010/0085169 A1* | 4/2010 | Poupyrev | G06F 3/03543 340/407.2 |
| 2011/0316798 A1 | 12/2011 | Jackson et al. | |
| 2012/0062516 A1* | 3/2012 | Chen | G06F 3/016 345/174 |
| 2012/0287068 A1* | 11/2012 | Colgate | G06F 3/016 345/173 |
| 2012/0327025 A1* | 12/2012 | Huska | G06F 3/016 345/174 |
| 2013/0154973 A1* | 6/2013 | Tung | G06F 3/041 345/173 |
| 2013/0215049 A1* | 8/2013 | Lee | G06F 3/0416 345/173 |
| 2013/0271412 A1* | 10/2013 | Adachi | G06F 3/016 345/173 |
| 2013/0307789 A1* | 11/2013 | Karamath | G06F 3/016 345/173 |
| 2014/0139452 A1* | 5/2014 | Levesque | G06F 3/0414 345/173 |
| 2014/0168105 A1 | 6/2014 | Zhou | |
| 2014/0333573 A1* | 11/2014 | Hong | G06F 3/016 345/174 |
| 2015/0138104 A1* | 5/2015 | Sugita | G06F 3/016 345/173 |
| 2015/0355710 A1 | 12/2015 | Modarres et al. | |
| 2016/0062505 A1* | 3/2016 | Hwang | G06F 3/0412 345/174 |
| 2016/0062537 A1* | 3/2016 | Kim | G06F 3/0416 345/174 |
| 2016/0179260 A1* | 6/2016 | Ham | G06F 3/0412 345/173 |
| 2016/0231838 A1* | 8/2016 | Wang | G06F 3/044 |
| 2016/0283029 A1* | 9/2016 | Hiratsuka | G06F 3/0416 |

FOREIGN PATENT DOCUMENTS

| | | |
|---|---|---|
| CN | 102844726 A | 12/2012 |
| CN | 103869960 A | 6/2014 |
| CN | 105278675 A | 1/2016 |
| CN | 106354317 A | 1/2017 |
| CN | 206236044 U | 6/2017 |

* cited by examiner

TOUCH DISPLAY PANEL AND DISPLAY DEVICE

CROSS-REFERENCE TO RELATED APPLICATIONS

The present application is the U.S. national phase entry of PCT/CN2017/088941, with an international filing date of Jun. 19, 2017, which claims the benefit of Chinese Patent Application No. 201610786395.1, filed on Aug. 30, 2016, the entire disclosures of which are incorporated herein by reference.

TECHNICAL FIELD

The present disclosure relates to the field of touch control technology, and particularly to a touch display panel and a display device.

BACKGROUND

With the development of touch display technology, especially the advent of wearable devices such as smart watches, smart bracelets and the like, a better user experience can be attractive for the user. Existing touch display devices typically will not provide feedback to the user's finger when a user performs a touch operation using his or her finger. Thus, during the touch operation, the user feels that his or her finger is sliding on a smooth surface, without being provided with a realistic tactile sensation.

SUMMARY

Embodiments of the present disclosure provide a touch display panel and a display device that seek to provide the user with a better user experience.

According to an aspect of the present disclosure, a touch display panel is provided which comprises: a touch display module having a light exit surface, the touch display module being operable to display an image via the light exit surface and to identify a touch position of a touch object on the displayed image; a plurality of touch feedback electrodes arranged in an array on the light exit surface, each of the plurality of touch feedback electrodes being operable to vibrate in response to a drive signal applied thereto to provide touch feedback to the touch object; and a first controller operably connected to the touch display module and the plurality of touch feedback electrodes, the first controller being configured to generate and provide the drive signal to at least one of the plurality of touch feedback electrodes corresponding to an identified touch position in response to identification of the touch position by the touch display module.

In some embodiments, the touch display panel further comprises a second controller configured to determine a texture level of the displayed image at the touch position. The first controller is further configured to generate the drive signal based on the determined texture level such that an amplitude of the drive signal reflects the determined texture level.

In some embodiments, the first controller comprises a microcontroller, an output circuit, and a switching network coupled between the output circuit and the plurality of touch feedback electrodes. The microcontroller is configured to a) determine the amplitude of the drive signal based on the determined texture level and generate a first control signal indicative of the determined amplitude, and b) generate, based on the identified touch position, a second control signal instructing the switching network to couple the output circuit to the at least one touch feedback electrode corresponding to the identified touch position. The output circuit is operable to generate the drive signal having the determined amplitude in dependence on the first control signal. The switching network is operable to couple the output circuit to the at least one touch feedback electrode corresponding to the identified touch position in dependence on the second control signal.

In some embodiments, the output circuit comprises a multi-harmonic oscillator, an amplifier, a voltage booster, and an adjustment circuit. The multi-harmonic oscillator is operable to generate a pulse signal. The amplifier is connected to the multi-harmonic oscillator and the voltage booster and is operable to amplify the pulse signal generated by the multi-harmonic oscillator and output the amplified pulse signal to the voltage booster. The voltage booster is connected to the adjustment circuit and the switching network and is operable to boost an amplitude of the pulse signal amplified by the amplifier and to supply the boosted pulse signal to the switching network as the drive signal. The adjustment circuit is connected to the microcontroller and is operable to adjust the amplitude of the pulse signal output by the booster in dependence on the first control signal from the microcontroller.

In some embodiments, the multi-harmonic oscillator comprises a first transistor, a second transistor, a first capacitor, a second capacitor, a first resistor, a second resistor, a third resistor, and a fourth resistor. A first terminal of the first resistor, a first terminal of the second resistor, a first terminal of the third resistor, and a first terminal of the fourth resistor are connected together. The first capacitor has a first terminal connected to a second terminal of the first resistor and a first electrode of the first transistor, and a second terminal connected to a second terminal of the second resistor and a control electrode of the second transistor. The second capacitor has a first terminal connected to a second terminal of the third resistor and a control electrode of the first transistor, and a second terminal connected to a second terminal of the fourth resistor and a first electrode of the second transistor. A second electrode of the first transistor and a second electrode of the second transistor are grounded.

In some embodiments, the amplifier comprises a fifth resistor, a third transistor and a fourth transistor. A first terminal of the fifth resistor is connected to the second terminal of the second capacitor. A second terminal of the fifth transistor is connected to a control electrode of the third transistor. A second electrode of the third transistor is connected to a control electrode of the fourth transistor. A first electrode of the fourth transistor is connected to a first electrode of the third transistor. A second electrode of the fourth transistor is grounded.

In some embodiments, the voltage booster comprises a boosting transformer and a third capacitor. A first terminal of the third capacitor is connected to a first terminal of a primary coil of the boosting transformer. A second terminal of the third capacitor is grounded. A second terminal of the primary coil of the boosting transformer is connected to the first electrodes of the third and fourth transistors.

In some embodiments, the adjustment circuit comprises a digital variable resistor having a first terminal connected to the first terminal of the fourth resistor and a second terminal connected to the first terminal of the third capacitor.

In some embodiments, the plurality of touch feedback electrodes are made of a substantially transparent piezoelectric material having an inverse piezoelectric effect.

In some embodiments, the touch display module comprises a substrate and a first electrode layer, an organic light emitting layer, and a second electrode layer sequentially formed on the substrate. The touch display module further comprises an enhancement layer operable to emit light in an electric field to enhance a brightness of the displayed image.

In some embodiments, the enhancement layer comprises ZnS.

In some embodiments, the enhancement layer is arranged above the second electrode layer.

In some embodiments, the enhancement layer is arranged beneath the second electrode layer.

In some embodiments, the touch display module further comprises a photosensitive material layer arranged between the organic light emitting layer and the second electrode layer and electrically connected to the enhancement layer. The photosensitive material layer is operable to create the electric field enabling light emission of the enhancement layer in response to light emitted by the organic light emitting layer.

In some embodiments, the touch display module is of a type selected from the group consisting of Add-On, In-Cell, On-Cell and OGS.

According to another aspect of the present disclosure, a display device is provided which comprises the touch display panel as described above.

These and other aspects of the present disclosure will be apparent from and elucidated with reference to the embodiment(s) described hereinafter.

DETAILED DESCRIPTION

Figure 1:
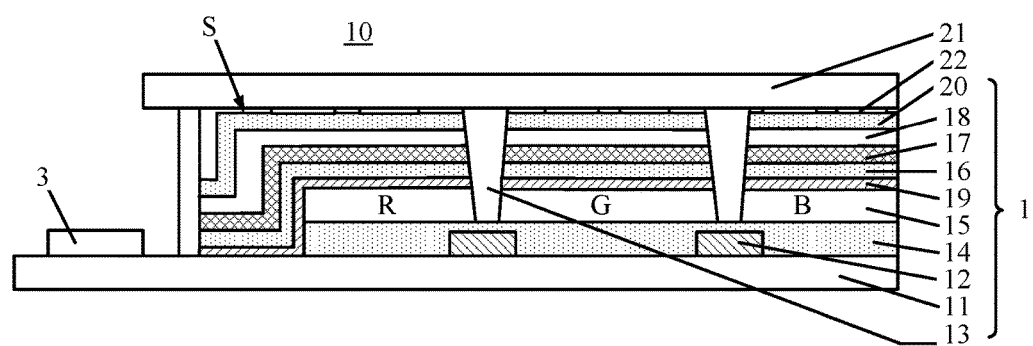
FIG. 1 schematically shows a cross-sectional view of a touch display panel according to an embodiment of the present disclosure.

The disclosure will now be described more fully hereinafter with reference to the accompanying drawings, in which exemplary embodiments of the disclosure are shown. The present disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In this context, any arrangement of devices to achieve the same functionality is effectively "associated" such that the desired functionality is achieved. Hence, any two devices herein combined to achieve a particular functionality may be seen as "associated with" each other such that the desired functionality is achieved, irrespective of architectures or intermediate devices. Likewise, any two devices so associated can also be viewed as being "operably connected" or "operably coupled" to each other to achieve the desired functionality.

Embodiments of the present disclosure will now be described in detail with reference to the accompanying drawings.

FIG. 1 schematically shows a cross-sectional view of a touch display panel 10 according to an embodiment of the present disclosure. As shown in FIG. 1, the touch display panel 10 includes a touch display module 1, a plurality of touch feedback electrodes 22, and a first controller 3.

The touch display module 1 has a light exit surface S. The touch display module 1 is operable to display an image via the light exit surface S and to identify a touch position of a touching the object (not shown in FIG. 1) on the displayed image.

In the example of FIG. 1, the touch display module 1 displays the image by means of organic light emitting diodes (OLEDs). Specifically, the touch display module 1 includes a substrate 11, an insulating layer 12, a first electrode layer 14, an organic light emitting layer 15, and a second electrode layer 16. The insulating layer 12, the first electrode layer 14, the light emitting layer 15, and the second electrode layer 16 are sequentially formed on the substrate 11. In some embodiments, the first electrode layer 14 may be an anode layer, and the second electrode layer 16 may be a cathode layer. In other embodiments, the first electrode layer 14 may be a cathode layer, and the second electrode layer may be an anode layer. It will be appreciated that the touch display panel 10 is not limited to an OLED type touch display panel, and that in other embodiments the touch display panel 10 may be an LCD type or any other type of touch display panel.

In the instant example, the touch display module 1 further includes a plurality of post spacer 13 and a touch sensing layer 20. A cover plate 21 is disposed opposite to the substrate 11 of the touch display module 1. The cover plate 21 may be made of a transparent material such as a transparent resin or glass. The plurality of spacer posts 13 protrude from the insulating layer 12 to support the cover plate 21. The touch sensing layer 20 typically includes a plurality of touch driving electrodes and a plurality of touch sensing electrodes that are crossed with and insulated from the touch driving electrodes, with the intersections forming capacitors operating as touch sensors. These touch sensors can operate as self-capacitive sensors or mutual-capacitive sensors. It will be appreciated that the touch display module 1 is not limited by the specific implementations illustrated. By way of example, and not limitation, the touch display module 1 may be implemented in the form of Add-On, In-Cell, On-Cell or OGS (One Glass Solution).

A plurality of touch feedback electrodes 22 are arranged in an array on the light exit surface S of the touch display module 1. Each of the plurality of touch feedback electrodes 22 is operable to vibrate in response to a drive signal applied thereto to provide touch feedback to the touch object.

In various embodiments, the plurality of touch feedback electrodes 22 may be made of a substantially transparent piezoelectric material having an inverse piezoelectric effect. Examples of such a piezoelectric material include, but are not limited to, lead lanthanum zirconate titanate (PLZT) ceramic. The term "substantially transparent" is intended to encompass "partially transparent". In this sense, "translucent" may be considered "substantially transparent".

The first controller 3 is located in a non-display area of the touch display module 1. The first controller 3 is operably connected to the touch display module 1 and the plurality of touch feedback electrodes 22. The first controller 3 is configured to generate and provide a drive signal to at least one of the plurality of touch feedback electrodes 22 corresponding to the identified touch position in response to the identification of the touch position by the touch display module 1.

By providing feedback in the form of vibration at the touch position, the user can obtain an enhanced experience when performing a touch operation using a touch object (e.g., a finger or stylus), even if the touch display panel 10 has a smooth surface (e.g., the upper surface of the cover plate 21).

Figure 2:
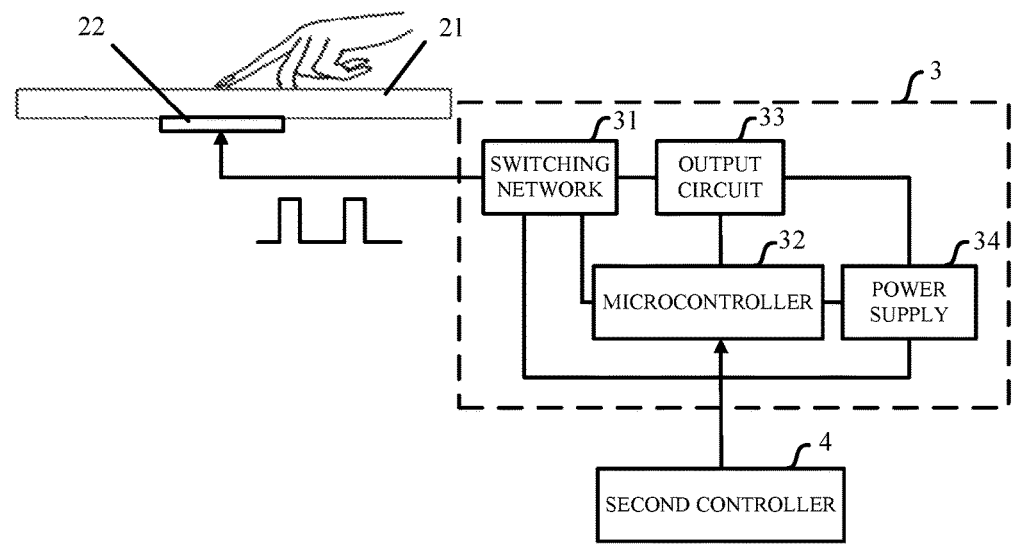
FIG. 2 schematically illustrates the operation principle of the touch display panel of FIG. 1.

FIG. 2 schematically shows the operation principle of the touch display panel 10 of FIG. 1.

As shown in FIG. 2, the first controller 3 applies a drive signal in the form of a pulse signal to the touch feedback electrode 22 corresponding to the touch position signal when the touch object (in this example, the user's finger) performs a touch operation on the cover plate 21. In the example, the pulse signal may have an amplitude in the range of 100-180V. It will be understood that although only one touch feedback electrode 22 is shown in FIG. 2, a single touch position may correspond to one or more touch feedback electrodes 22, depending on the size of each touch feedback electrode 22 and the area of the portion of the touch object that is in contact with the cover plate 21 at the touch position.

In some embodiments, a further enhanced operational experience may be provided by taking into account a texture level of the image displayed by the touch display module 1 at the touch position. For this purpose, a second controller 4 is provided to perform image processing on the currently displayed image to determine the texture level of the displayed image at the touch position. The first controller 3 is further configured to generate a drive signal based on the determined texture level such that the amplitude of the drive signal reflects the determined texture level. The higher the texture level, the greater the amplitude of the drive signal is, and thus the stronger the vibration of the touch feedback electrode. In this way, vibration feedback that matches the texture level can be provided, thus providing a further enhanced user experience.

The texture level may typically be indicated by edge strength, and accordingly the image processing performed by the second controller 4 may include edge detection, such as, for example, Canny edge detection. Specifically, the second controller 4 may perform edge detection on one or more image blocks at the touch position and send the determined texture level to the first controller 3. The second controller 4 may be a control chip of the touch display module 1, and thus may identify the touch position (via the touch sensing layer 20) and send it to the first controller 3.

In the example shown in FIG. 2, the first controller 3 includes a microcontroller 32, an output circuit 33, and a switching network 31 coupled between the output circuit 33 and the plurality of touch feedback electrodes 22. The first controller 3 may further include a power supply 34 for powering the microcontroller 32, the output circuit 33, and the switching network 31.

The microcontroller 32 is configured to determine the amplitude of the drive signal to be applied to at least one touch feedback electrode 22 corresponding to the touch position based on the texture level determined by the second controller 4 and to generate a first control signal indicative of the determined amplitude. The microcontroller 32 is further configured to generate a second control signal instructing the switching network 31 to couple the output circuit 33 to the at least one touch feedback electrode 22 corresponding to the touch position identified by the second controller 4 based on the identified touch position.

The output circuit 33 is operable to generate a drive signal having the determined amplitude in dependence on the first control signal. The details of the output circuit 33 will be described later.

The switching network 31 is operable to couple the output circuit 33 to the at least one touch feedback electrode 22 corresponding to the touch position in dependence on the second control signal. In some embodiments, the switching network 31 may be a configurable data crossbar, which may be configured to couple the output circuit 33 to any of the plurality of touch feedback electrodes 22.

The first controller 3 and the second controller 4 may be implemented in a number of ways, such as with dedicated hardware, to perform the various functions discussed herein. A "processor" is an example of the controller that employs one or more microprocessors that can be programmed using software (e.g., microcode) to perform the various functions discussed herein. The controller may be implemented with or without a processor, and may also be implemented as a combination of dedicated hardware for performing some functions and a processor that performs other functions (e.g., one or more programmed microprocessors and associated circuitry). Examples of controller components that may be employed in various embodiments of the present disclosure include, but are not limited to, conventional microprocessors, application specific integrated circuits (ASICs), and field programmable gate arrays (FPGAs). It will be understood that the first controller 3 is not necessarily a separate device. For example, the microcontroller 32 may be incorporated into the second controller 4.

Figure 3:
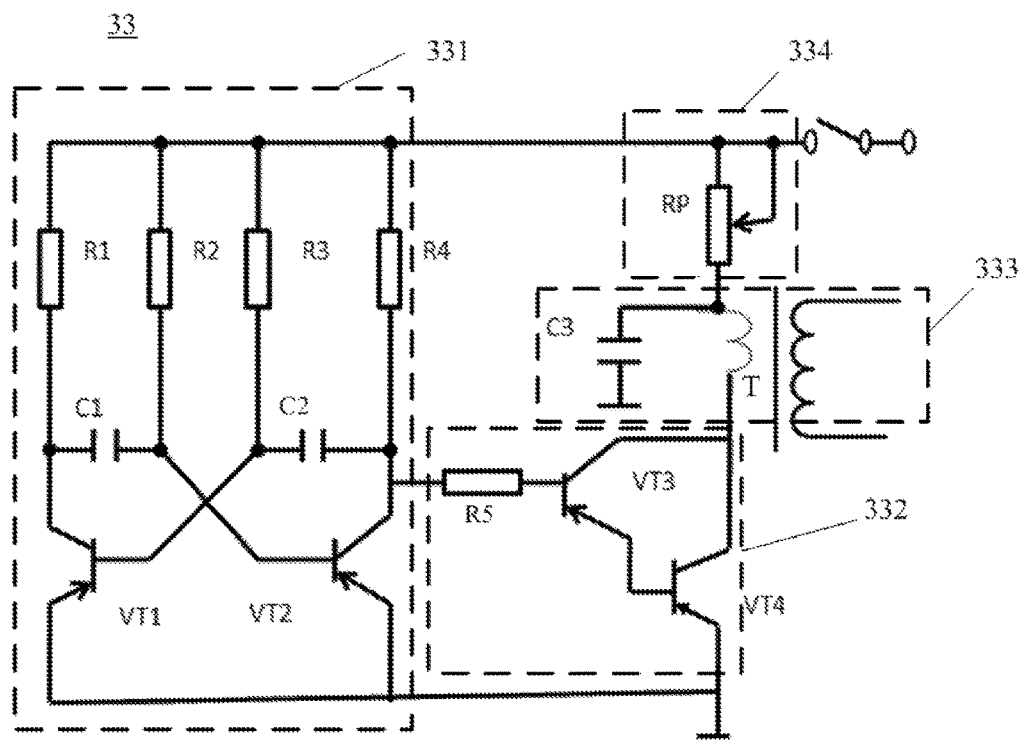
FIG. 3 schematically shows a circuit diagram of the output circuit in FIG. 2.

FIG. 3 schematically shows a circuit diagram of the output circuit 33 in FIG. 2. As shown in FIG. 3, the output circuit 33 includes a multi-harmonic oscillator 331, an amplifier 332, a voltage booster 333, and an adjustment circuit 334.

The multi-harmonic oscillator 331 is operable to generate a pulse signal. Specifically, the multi-harmonic oscillator 331 includes a first transistor VT1, a second transistor VT2, a first capacitor C1, a second capacitor C2, a first resistor R1, a second resistor R2, a third resistor R3, and a fourth resistor R4. A first terminal of the first resistor R1, a first terminal of the second resistor R2, a first terminal of the third resistor R3 and a first terminal of the fourth resistor R4 are connected together. A first terminal of the first capacitor C1 is connected to a second terminal of the first resistor R1 and a first electrode of the first transistor VT1. A second terminal of the first capacitor C1 is connected to a second terminal of the second resistor R2 and a control electrode of the second transistor VT2. A first terminal of the second capacitor C2 is connected to a second terminal of the third resistor R3 and a control electrode of the first transistor VT1. A second terminal of the second capacitor C2 is connected to a second terminal of the fourth resistor R4 and a first electrode of the second transistor VT2. A second electrode of the first transistor VT1 and a second electrode of the second transistor VT2 are grounded.

The amplifier 332 is connected to the multi-harmonic oscillator 331 and the voltage booster 333, and is operable to amplify the pulse signal generated by the multi-harmonic oscillator 331 and output the amplified pulse signal to the voltage booster 333. Specifically, the amplifier 332 includes a fifth resistor R5, a third transistor VT3, and a fourth transistor VT4. A first terminal of the fifth resistor R5 is connected to a second terminal of the second capacitor C2. A second terminal of the fifth resistor R5 is connected to a control electrode of the third transistor VT3. A second electrode of the third transistor VT3 is connected to a control electrode of the fourth transistor VT4. A first electrode of the fourth transistor VT4 is connected to a first electrode of the third transistor VT3. A second electrode of the fourth transistor VT4 is grounded.

The voltage booster 333 is connected to the adjustment circuit 334 and the switching network 31 (FIG. 3), and is operable to boost the amplitude of the pulse signal amplified by the amplifier 332 and supply the boosted pulse signal to the switching network 31 as the drive signal. Specifically, the voltage booster 333 includes a boosting transformer T and a third capacitor C3. A first terminal of the third capacitor C3 is connected to a first terminal of a primary coil of the boosting transformer T. A second terminal of the third capacitor C3 is grounded. A second terminal of the primary coil of the boosting transformer T is connected to the third transistor VT3 and the first electrode of the fourth transistor VT4. A secondary coil of the boosting transformer T is coupled to the switching network 31 (FIG. 3).

The adjustment circuit 334 is connected to the microcontroller 32 (FIG. 3) and is operable to adjust the amplitude of the pulse signal output by the voltage booster 333 in dependence on the first control signal from the microcontroller 32. Specifically, the adjustment circuit 334 includes a digital variable resistor RP. A first terminal of the digital variable resistor RP is connected to the first terminal of the fourth resistor R4. A second terminal of the digital variable resistor RP is connected to the first terminal of the third capacitor C3. The resistance connected into the voltage booster 333 can be adjusted by the varying resistance of the digital variable resistor RP.

Referring back to FIG. 1, the touch display module 1 further includes an enhancement layer 18 operable to emit light in an electric field to enhance the brightness of the displayed image. This may be advantageous for compensating the loss of light transmission of the touch display panel 10 due to the touch sensing layer 20 and the touch feedback electrodes 22.

In some embodiments, the enhancement layer 18 may comprise a material of ZnS. This may be particularly advantageous for compensation for the loss of the brightness at the touch position. When the touch screen is pressed, local deformation of the components within the touch display module 1 (e.g., the organic light emitting layer 15) may be caused, which will result in a change in local resistance and hence a change in current/voltage, leading to reduction of the brightness of the image displayed at the touch position. The inherent properties of ZnS can be used to counter the reduction in brightness due to the local deformation. The ZnS material has an electroluminescent effect and, when pressed under pressure, will be locally thinned, resulting in an enhanced internal electric field with the voltage maintained constant, and thus resulting in an enhanced electroluminescent effect. Therefore, the reduction in brightness due to the local deformation will be compensated.

The enhancement layer 18 may be arranged on the second electrode layer 16. In the example of FIG. 1, an isolation layer 17 is also provided between the second electrode layer 16 and the enhancement layer 18. This may provide enhanced isolation between the second electrode layer 16 and the touch sensing layer 20.

As shown in FIG. 1, the touch display module 1 further comprises a photosensitive material layer 19. The photosensitive material layer 19 is formed on the organic light emitting layer 15, i.e., between the organic light emitting layer 15 and the second electrode layer 16. The photosensitive material layer 19 is electrically connected to the enhancement layer 18 and is operable to, responsive to the light emitted from the organic light emitting layer 15, create an electric field for causing the enhancement layer 18 to emit light.

In some embodiments, the photosensitive material layer 19 comprises a material of P3OT (poly-3-octyl-substituted polythiophene). Such a photosensitive material has a photovoltaic effect so that it can convert a portion of the light emitted from the organic light emitting layer 15 into electrical energy to excite the enhancement layer 18 (e.g., ZnS) to emit light, thereby further enhancing the brightness of the touch display panel 10.

Figure 4:
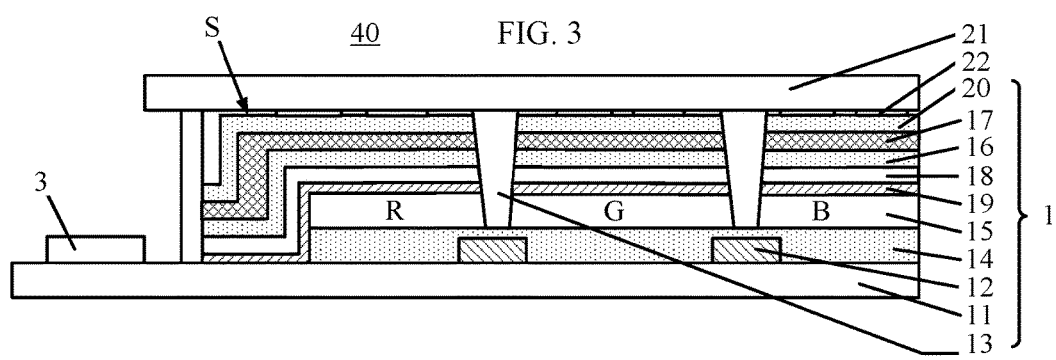
FIG. 4 schematically shows a cross-sectional view of a touch display panel according to another embodiment of the present disclosure.

FIG. 4 schematically shows a cross-sectional view of a touch display panel 40 according to another embodiment of the present disclosure. The same reference numerals refer to the same elements as compared to the embodiment of FIG. 1, and the enhancement layer 18 is now arranged beneath the second electrode layer 16, i.e. between the photosensitive material layer 19 and the second electrode layer 16. This may provide enhanced brightness compensation since the enhancement layer 18 and the photosensitive material layer 19 are now more closely coupled together so that the light emitted by the photosensitive material layer 19 can be utilized more efficiently by the enhancement layer 18.

The present disclosure also provides a display device comprising the touch display panel as described above. The details of the touch display panel are not described here for conciseness.

Examples of the display device include, but are not limited to, mobile phones, tablets, televisions, displays, laptops, digital photo frames, navigators, and the like.

It is to be understood that the described embodiments are illustrative and exemplary and not restrictive. Various variations and modifications can be made by those skilled in the art without departing from the spirit and essence of the present disclosure, which variations and modifications are also intended to be within the scope of the present disclosure.

What is claimed is:

1. A touch display panel, comprising:
a touch display module having a light exit surface, the touch display module being operable to display an image via the light exit surface and to identify a touch position of a touch object on the displayed image;
a plurality of touch feedback electrodes arranged in an array on the light exit surface, each of the plurality of touch feedback electrodes being operable to vibrate in response to a drive signal applied thereto to provide touch feedback to the touch object;
a first controller operably connected to the touch display module and the plurality of touch feedback electrodes, the first controller being configured to generate and provide the drive signal to at least one of the plurality of touch feedback electrodes corresponding to an identified touch position in response to identification of the touch position by the touch display module; and
a second controller configured to determine a texture level of the displayed image at the touch position,
wherein the first controller is further configured to generate the drive signal based on the determined texture level such that an amplitude of the drive signal reflects the determined texture level, the first controller comprising a microcontroller, an output circuit, and a switching network coupled between the output circuit and the plurality of touch feedback electrodes, wherein:
the microcontroller is configured to a) determine the amplitude of the drive signal based on the determined texture level and generate a first control signal indicative of the determined amplitude, and b) generate, based on the identified touch position, a second control signal instructing the switching network to couple the output circuit to the at least one touch feedback electrode corresponding to the identified touch position;
the output circuit is operable to generate the drive signal having the determined amplitude in dependence on the first control signal; and
the switching network is operable to couple the output circuit to the at least one touch feedback electrode corresponding to the identified touch position in dependence on the second control signal, and
wherein the output circuit comprises a multi-harmonic oscillator, an amplifier, a voltage booster, and an adjustment circuit, wherein:
the multi-harmonic oscillator is operable to generate a pulse signal;
the amplifier is connected to the multi-harmonic oscillator and the voltage booster and is operable to amplify the pulse signal generated by the multi-harmonic oscillator and output the amplified pulse signal to the voltage booster;
the voltage booster is connected to the adjustment circuit and the switching network and is operable to boost an amplitude of the pulse signal amplified by the amplifier and to supply the boosted pulse signal to the switching network as the drive signal; and
the adjustment circuit is connected to the microcontroller and is operable to adjust the amplitude of the pulse signal output by the voltage booster in dependence on the first control signal from the microcontroller.

2. The touch display panel of claim 1, wherein the multi-harmonic oscillator comprises a first transistor, a second transistor, a first capacitor, a second capacitor, a first resistor, a second resistor, a third resistor, and a fourth resistor, wherein:
a first terminal of the first resistor, a first terminal of the second resistor, a first terminal of the third resistor, and a first terminal of the fourth resistor are connected together;
the first capacitor has a first terminal connected to a second terminal of the first resistor and a first electrode of the first transistor, and a second terminal connected to a second terminal of the second resistor and a control electrode of the second transistor;
the second capacitor has a first terminal connected to a second terminal of the third resistor and a control electrode of the first transistor, and a second terminal connected to a second terminal of the fourth resistor and a first electrode of the second transistor; and a second electrode of the first transistor and a second electrode of the second transistor are grounded.

3. The touch display panel of claim 2, wherein the amplifier comprises a fifth resistor, a third transistor and a fourth transistor, wherein a first terminal of the fifth resistor is connected to the second terminal of the second capacitor, wherein a second terminal of the fifth resistor is connected to a control electrode of the third transistor, wherein a second electrode of the third transistor is connected to a control electrode of the fourth transistor, wherein a first electrode of the fourth transistor is connected to a first electrode of the third transistor, and wherein a second electrode of the fourth transistor is grounded.

4. The touch display panel of claim 3, wherein the voltage booster comprises a boosting transformer and a third capacitor, wherein a first terminal of the third capacitor is connected to a first terminal of a primary coil of the boosting transformer, wherein a second terminal of the third capacitor is grounded, and wherein a second terminal of the primary coil of the boosting transformer is connected to the first electrodes of the third and fourth transistors.

5. The touch display panel of claim 4, wherein the adjustment circuit comprises a digital variable resistor having a first terminal connected to the first terminal of the fourth resistor and a second terminal connected to the first terminal of the third capacitor.

6. The touch display panel according to claim 2, wherein the touch display module comprises a substrate and a first electrode layer, an organic light emitting layer, and a second electrode layer sequentially formed on the substrate, and wherein the touch display module further comprises an enhancement layer operable to emit light in an electric field to enhance a brightness of the displayed image.

7. The touch display panel according to claim 1, wherein the plurality of touch feedback electrodes are made of a substantially transparent piezoelectric material having an inverse piezoelectric effect.

8. The touch display panel according to claim 1, wherein the touch display module comprises a substrate and a first electrode layer, an organic light emitting layer, and a second electrode layer sequentially formed on the substrate, and wherein the touch display module further comprises an enhancement layer operable to emit light in an electric field to enhance a brightness of the displayed image.

9. The touch display panel of claim 8, wherein the enhancement layer comprises ZnS.

10. The touch display panel of claim 9, wherein the enhancement layer is arranged above the second electrode layer.

11. The touch display panel of claim 9, wherein the enhancement layer is arranged beneath the second electrode layer.

12. The touch display panel of claim 8, wherein the touch display module further comprises a photosensitive material layer arranged between the organic light emitting layer and the second electrode layer and electrically connected to the enhancement layer, and wherein the photosensitive material layer is operable to create the electric field enabling light emission of the enhancement layer in response to light emitted by the organic light emitting layer.

13. The touch display panel of claim 1, wherein the touch display module is of a type selected from the group consisting of Add-On, In-Cell, On-Cell and OGS.

14. A display device comprising the touch display panel as claimed in claim 1.

* * * * *